(12) United States Patent
Berndlmaier et al.

(10) Patent No.: US 7,129,557 B2
(45) Date of Patent: Oct. 31, 2006

(54) AUTONOMIC THERMAL MONITOR AND CONTROLLER FOR THIN FILM DEVICES

(75) Inventors: Zachary E. Berndlmaier, North Hero, VT (US); Edward W. Kiewra, Verbank, NY (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 10/853,800

(22) Filed: May 25, 2004

(65) Prior Publication Data

US 2005/0275054 A1    Dec. 15, 2005

(51) Int. Cl.
*H01L 31/058* (2006.01)
(52) U.S. Cl. .................. 257/470; 257/467; 257/347
(58) Field of Classification Search ................ 257/470; 438/54

See application file for complete search history.

(56) References Cited

U.S. PATENT DOCUMENTS 5,016,070 A * 5/1991 Sundaresan ................ 257/302
5,105,253 A * 4/1992 Polllock ..................... 257/514
6,071,803 A * 6/2000 Rutten et al. ............... 438/618
2003/0058016 A1   3/2003 Mizugaki
2004/0123171 A1* 6/2004 Zhang et al. ............... 713/322

FOREIGN PATENT DOCUMENTS

| JP | 1110746 A | 4/1989 |
| JP | 1241157 A | 9/1989 |
| JP | 3034360 A | 2/1991 |
| JP | 6265593 A | 9/1994 |
| JP | 7022548 A | 1/1995 |
| JP | 8136356 A | 5/1996 |
| JP | 2001083017 A | 3/2001 |

* cited by examiner

*Primary Examiner*—Douglas W. Owens
*Assistant Examiner*—Hoang-Quan Ho
(74) *Attorney, Agent, or Firm*—William N. Hogg; Driggs, Hogg & Fry Co., LPA

(57) ABSTRACT

A thermal monitor diode is provided that comprises a silicon thin film on an insulator mounted on a silicon substrate. An opening extends through the silicon thin film and through the insulator and partially into the silicon substrate and terminates at an end wall. A conductive material is disposed in the opening and extends to the end wall. The substrate has a P/N junction formed therein adjacent the end wall, and an insulating spacer material surrounds the conductive material and is sufficiently thin to allow temperature excursions in the silicon thin film to pass therethrough. The invention also contemplates a method of forming the diode.

13 Claims, 3 Drawing Sheets

AUTONOMIC THERMAL MONITOR AND CONTROLLER FOR THIN FILM DEVICES

FIELD OF THE INVENTION

This invention relates generally to the monitoring of temperature excursions in devices in thin film technology, and more particularly to a rapid thermally responsive diode located adjacent an area where a device or group of devices in a silicon-on-insulator (SOI) thin film technology can cause a temperature excursion, which needs to be monitored and/or controlled.

BACKGROUND OF THE INVENTION

In thin film technology for the formation of integrated circuit (I/C) chips, it is often necessary to monitor and/or control the internal chip, sub circuit, or voltage island temperature. According to the prior art, a typical technique for sensing such temperatures is the use of a thermocouple. However, in many instances, the accuracy of the thermocouple is inadequate to perform the real time automatic control of the I/C chip or chips necessary or desirable. It is, therefore, desirable to provide a rapid response time temperature sensor and/or controller in thin film I/C chip circuit technology.

SUMMARY OF THE INVENTION

A thermal monitor diode is provided that comprises a silicon thin film on an insulator on a silicon substrate known as a silicon-on-insulator (SOI). An opening extends through the silicon thin film and through the insulator and partially into the silicon substrate and terminates at an end wall. A conductive material is disposed in the opening and extends to the end wall. The substrate has a P/N junction formed therein adjacent the end wall, and an insulating spacer material surrounds the conductive material, and is sufficiently thin to allow temperature excursions in the silicon thin film to pass therethrough. The invention also contemplates a method of forming the diode.

BRIEF DESCRIPTION OF THE DRAWINS

Figure 5:
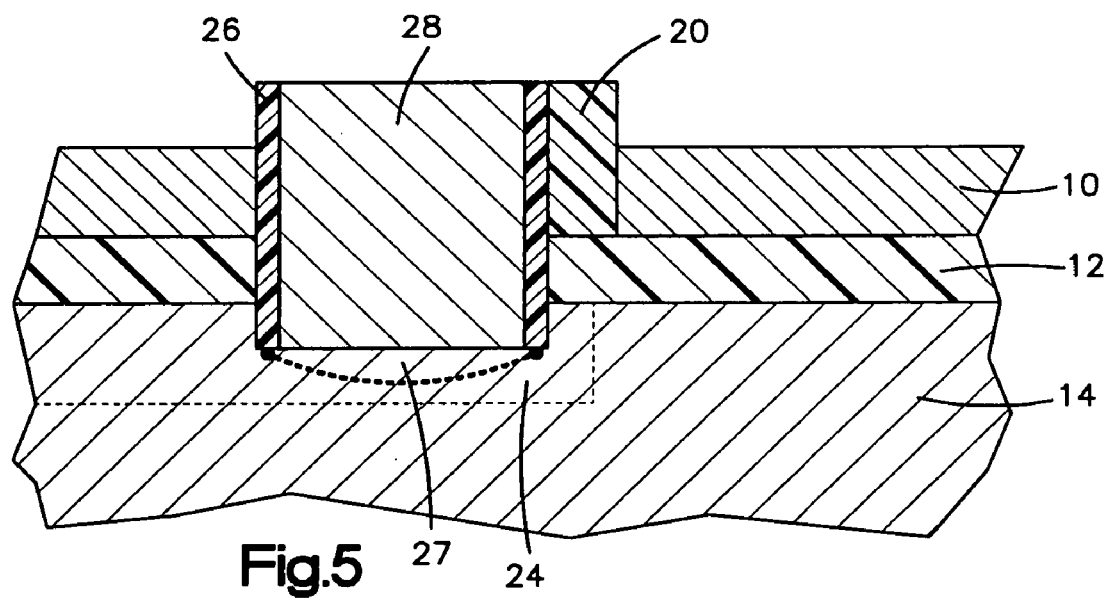
Figure 6:
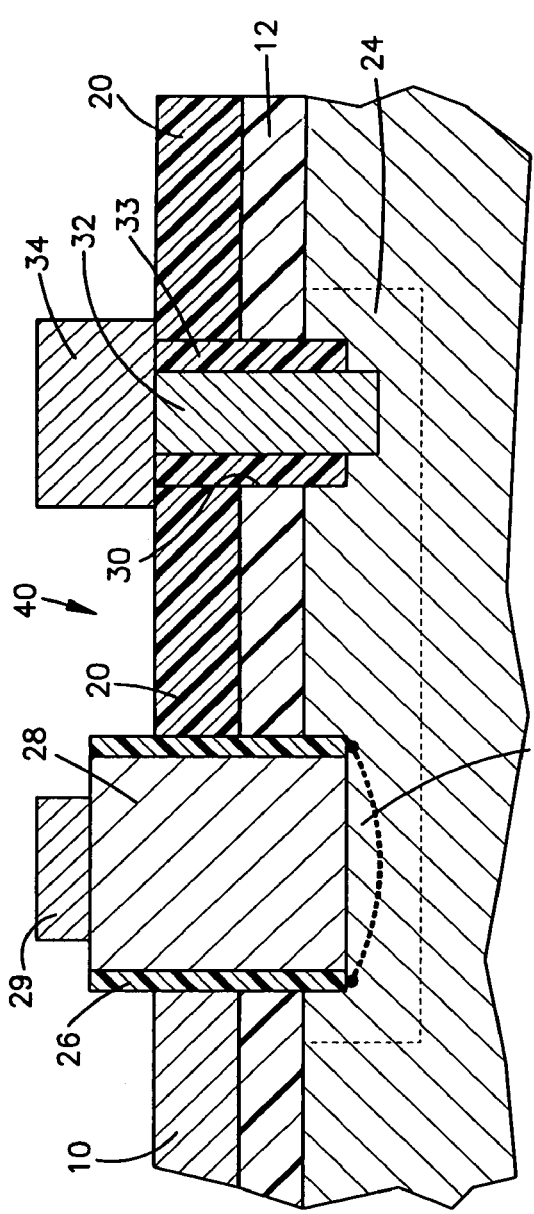
Figure 7:
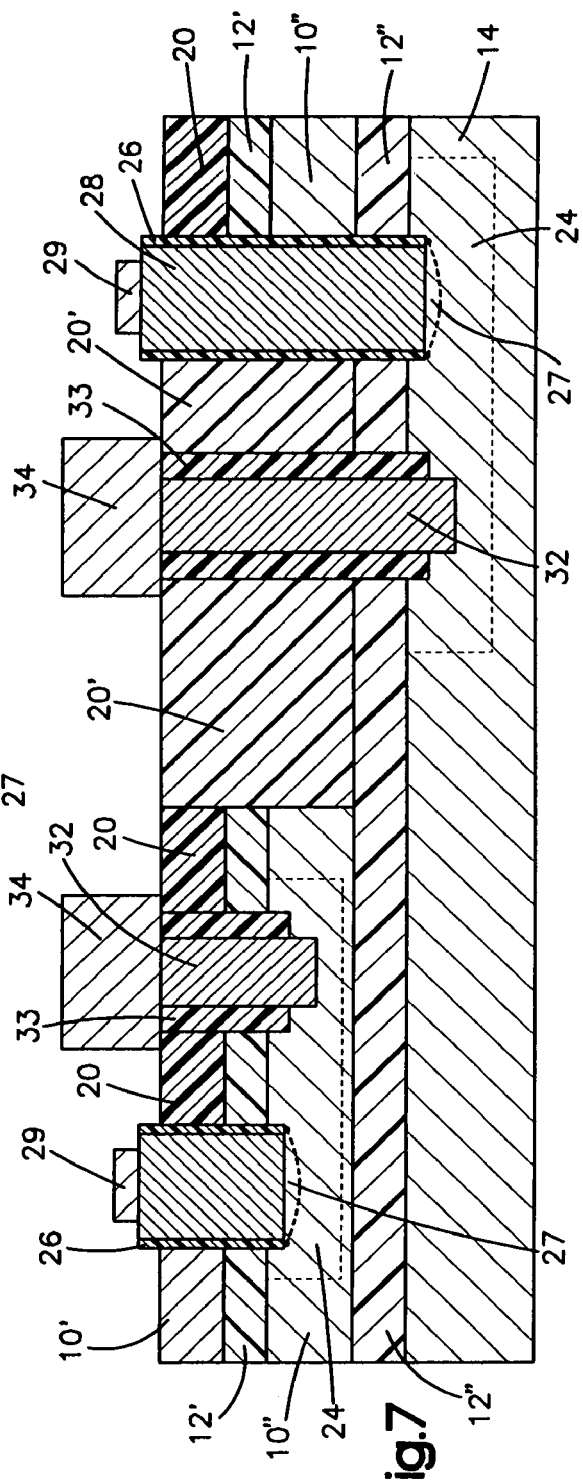

FIGS. 1–6 show, somewhat schematically, the steps in forming one embodiment of the present invention; and FIG. 7 shows other embodiments of the present invention.

DESCRIPTION OF THE PREFERRED EMBODIMENT(S)

Before describing the process and the finished product, a brief overview of the product of the present invention will be given. A diode is formed in a semiconductor material, in proximity to which devices are formed, the diode being thermally responsive, and in close enough proximity to provide a quick and accurate response to any thermal excursion from any selected direction on the semiconductor material. This is accomplished by providing a semiconductor substrate or other layer of semiconductor below the thin film semiconductor, extending the diode into the semiconductor substrate or other layer of semiconductor material where the necessary P/N junction is formed, providing only a thin shell insulator around the diode oriented in the direction from which the temperature is to be sensed, and providing a thick insulation around the thin shell insulator oriented in any direction from which the temperature is not to be sensed (if desired). Thus, the diode is temperature sensitive, and may be formed in proximity to other devices.

Figure 1:
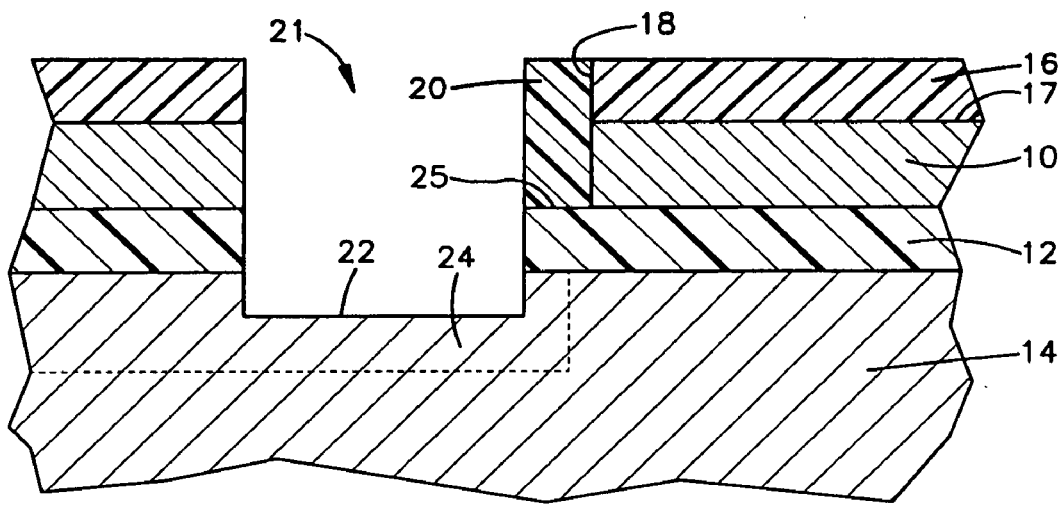

Referring now to the drawings, FIGS. 1–6 show the various steps in the processing to form one embodiment of the diode of the present invention. FIG. 1 is the starting step shown; however, various steps are performed to bring the initial material to this form. Since the steps used to reach the stage shown in FIG. 1 are conventional, they are not shown in detail, and are described only very broadly herein, since the steps are well known to those skilled in the art.

As shown in FIG. 1, a silicon or other semiconductor thin film 10 is provided with an insulator 12 (preferably silicon dioxide). This combination of silicon thin film 10 and insulator 12 is sometimes referred to as SOI (Silicon On Insulator). The thin film 10 is comprised of silicon or a combination of Si and Ge, hereinafter for convenience referred to as silicon. The SOI combination is mounted or formed on a semiconductor substrate 14, preferably p-doped silicon. A silicon nitride (SiN) pad 16 is disposed on the upper surface 17 of the silicon thin film 10 using chemical vapor deposition (CVD). A shallow trench isolation (STI) is formed as is known to those skilled in the art comprised of an opening 18 patterned using photolithography and dry etching, such as reactive ion etching (RIE) through pad 16 and silicon thin film 10, down to the insulator 12, and into which opening 18 insulating dielectric material 20, such as silicon dioxide, is deposited and planarized using chemical mechanical planarization (CMP). Another opening 21 is patterned by photolithography and RIE through the pad 16, the thin film 10 and the insulator 12 into the substrate 14, terminating at an end wall 22. A buried p-well doped region 24 is formed using photolithography and ion implantation through the SOI into the underlayer substrate 14.

As indicated earlier, the processes for forming this structure shown in FIG. 1 are conventional and, thus, need not be set forth in any detail, since these processes are well known to those skilled in the art. However, to briefly review these processes, first an SOI structure 10, 12 is mounted on a silicon substrate 14 and the silicon nitride pad 16 is deposited on the thin film 10 by LPCVD (Low Pressure Chemical Vapor Deposition). Opening 18 is then formed by photolithographic, photoresist and reactive ion etching (RIE) down to the top surface 25 of the insulator 12. The oxide insulating material 20 is then deposited, preferably by a combination of LPCVD and high-density plasma (HDP) processes, in the opening 18. A planarization process, such as Chem/Mec polishing (CMP), is used to planarize the STI dielectric 20 to the surface of the pad SiN film 16. Opening 21 is then formed by photolithography and RIE processing through the silicon nitride pad 16, the silicon thin film 10, and the insulator 12 into the silicon substrate 14 to end wall 22. The opening 21 is bounded by side wall 23. The p-well 24 is formed in the p-substrate by conventional ion implantation. Thus, there is formed the structure shown in FIG. 1.

Figure 2:
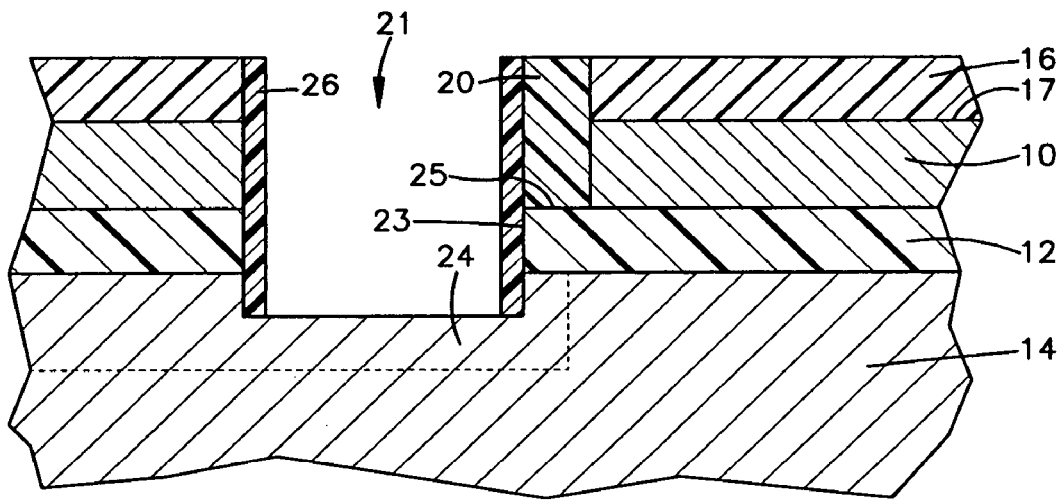

As shown in FIG. 2, an insulating sidewall spacer 26 is then formed as is known to those skilled in the art. This is formed by deposition of a conformal thin film, such as CVD (Chemical Vapor Deposition), of silicon dioxide over the top surface of the silicon nitride pad 16, the top of the insulating material 20, the side wall 23 of the opening 21, and the end wall 22 of opening 21. Following this, an anisotropic dry etch, such as RIE using feedgasses including a mixture or combination of $CF_4$, $CHF_3$, $O_2$, $N_2$, Ar, $N_2$, CO of the deposited silicon dioxide material, is performed. This will remove the silicon dioxide from the bottom wall 22 and the top of the silicon nitride pad 16 and the top of the insulating material 20, but will not remove the insulating spacer material 26 on the side wall 23 of the opening 21 since the etch is a directional anisotropic etch, such as RIE. The thickness of the insulating spacer material 26 is between about 5 and about 200 nm, preferably about 10 nm.

Figure 3:
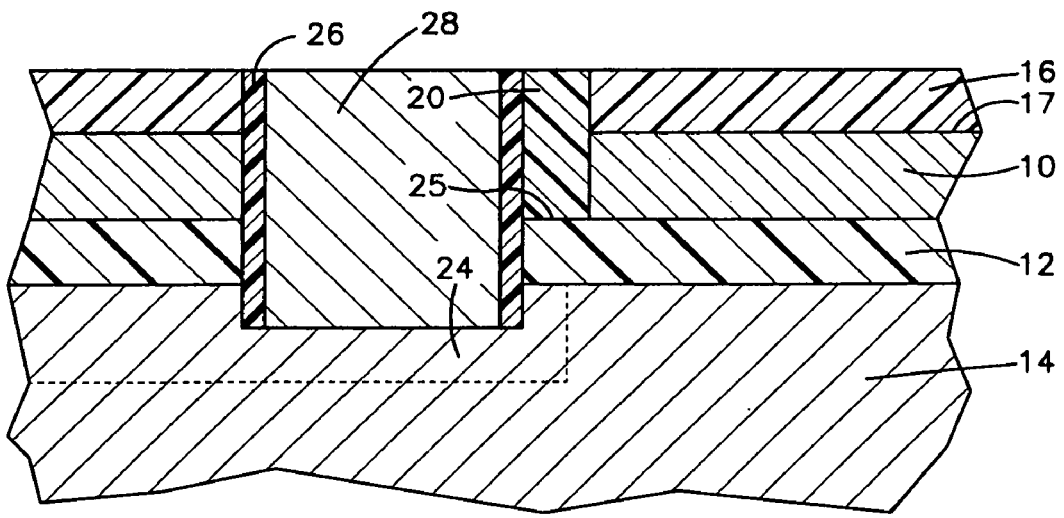

Referring now to FIG. 3, polysilicon 28 is deposited into the opening 21, preferably by CVD deposition. The polysilicon may be deposited as n+ doped, or it may be doped during subsequent processing. A CMP is used to planarize the doped polysilicon 28 to the level of the pad SiN 16. In the disclosed embodiment, the polysilicon 28 is deposited as n+ doping. The insulating spacer material 26 provides electrical insulation between the polysilicon 28 and the SOI silicon thin film 10, but is thin enough to allow thermal conduction to take place between the silicon thin film 10 and the polysilicon 28 so that the inventive structure diode formed in proximity to the SOI 10 and the devices formed in SOI 10 will provide accurate monitoring of the temperature of the SOI layer 10.

(The diode to be formed will operate responsive to a given heat rise in the silicon thin film 10 due to devices contained in the silicon thin film 10 and not shielded by the insulating material 20, which prevents the passage of any significant heat build-up in the silicon thin film, all as will be described presently.)

Figure 4:
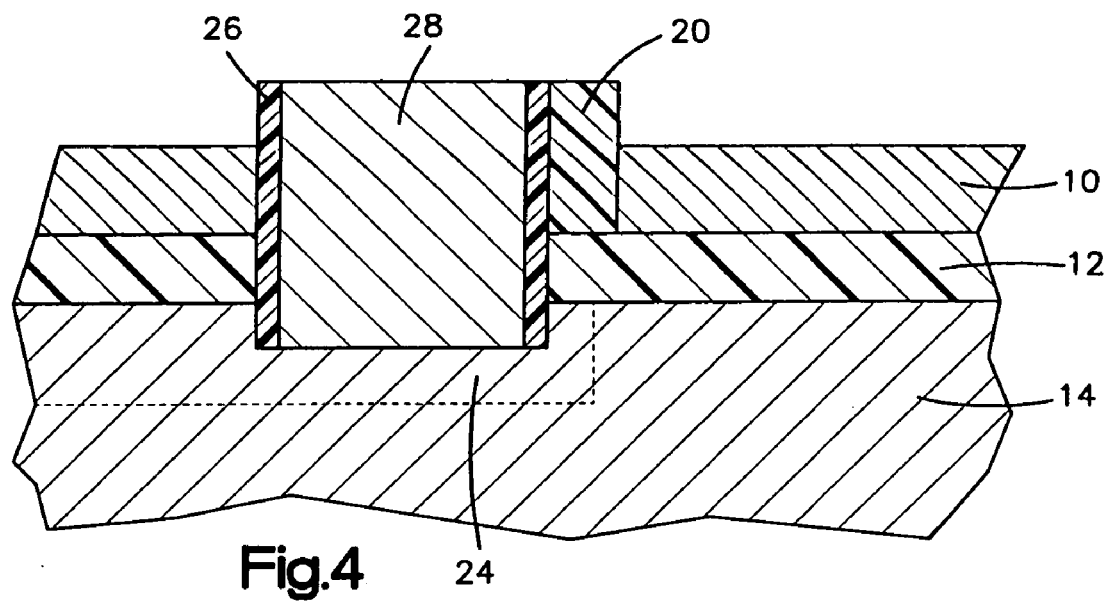

Referring now to FIG. 4, the silicon nitride pad 16 is removed, preferably by hot phosphoric acid, in a conventional manner. It should be noted that the insulating spacer 26 and polysilicon 28 extend above the surface of the SOI layer 10 by an amount equal to the thickness of the pad SiN layer 16 which remains after the CMP steps used for the STI oxide 20 and the polysilicon 28. However, no specific planarizing step needs to be performed since, in later processing, not a part of this invention, the surface may be planarized in association with the formation of interconnect. Even if it is not, the slight protrusion above the silicon thin film 10 is not detrimental to the inventive structure.

Referring now to FIG. 5, the structure is heated to activate the dopants and, in the process, also drive some of the n-type dopant impurities from the polysilicon layer into the p-well region 24 forming a P/N junction diode between region 27 and the p-well 24. The heating may take place during subsequent thermal processes on the thin film, such as gate oxide growth of a MOSFET transistor, or source/drain activation rapid thermal processing as is known to those skilled in the art. Alternatively, the n-type dopants can be implanted along with the implantation of the polysilicon as described earlier. The n+ implant 27 in the p-well provides the necessary N/P diode junction. (It is to be understood that the polarities could be reversed; i.e. the well 24 could be an n+ well and the polysilicon 28 and implant 27 could be a p-well.)

Referring now to FIG. 6, a tungsten stud 29 is formed in the process of conventional interconnect fabrication in contact with the polysilicon 28. A second opening 30 is patterned in the thin film 10 and p+ doped polysilicon contact 32 extends through insulator 20 and is covered by insulating material 33. The contact 32 extends through insulator 12 into the p-well 24 to complete the circuit with the polysilicon 28, thus forming a complete diode structure 40. (The insulating material 33 and 20 is sufficiently thick to prevent any appreciable passage of heat to the polysilicon material 32.) A second tungsten stud 34 is secured to the polysilicon 32, and the studs 29 and 34 can be wired into the chip circuitry in a conventional manner as a diode 40 to sense any temperature changes which are indicated by change in current flow in the diode formed by the N/P junction. The following formula gives the current with respect to change in temperature: $If = Io^{(qVa/kT)}$.

For a P+/n− diode, Va is the applied voltage defined with the n− side at ground. Thus, Va is Positive in sign. Here diode ideality is assumed 1.

In operation, diode 40, so formed, operates as follows: If a device or group of devices, contained on or in the silicon thin film 10, generates heat during operation, and if the device, or group of devices, generating heat is not shielded from the polysilicon 28 by the insulating material 20, but only by the insulating spacer 26 (i.e. a device, or group of devices, to the left of the polysilicon 28, as shown in FIGS. 1–6), then the temperature rise will be transmitted through spacer 26 to, and sensed by, the diode 40 and the current therein increased, since the insulating spacer 26 is thin enough to pass heat therethrough. At some given level, the circuitry on the chip, in a well known manner, will either generate an alarm, or actually turn off the device, or group of devices, causing the temperature rise. However, any increase in temperature caused by a device, or group of devices, shielded by the insulating material 20 from the polysilicon 28 (i.e. the devices to the right of the polysilicon 28 as seen in FIGS. 1–6) will not cause an increase in current in the diode 40, since the insulating material 20 is thick enough to prevent any appreciable heat passing therethrough to thus increase the heat at the polysilicon 28. Thus, the extent to which the insulating material 20 surrounds the polysilicon 28 will determine the location of the devices which are thermally shielded from the diode. Hence, it will be appreciated that, in fact, in some instances there may not need to be any insulating material 12 and, therefore, heat would be sensed in any direction from devices in silicon thin film 10. Referring now to FIG. 7, two different embodiments of a temperature sensing diode according to this invention are shown. In these embodiments, multiple layers of silicon thin films on silicon dioxide layers 12 are shown. (One embodiment is shown on the left hand side of the drawing, and the other on the right hand side.) In these embodiments, two layers of silicon thin films 10' and 10", each one on a layer of silicon dioxide insulator 12' and 12" are provided. The lower layer of silicon dioxide 12" is disposed on a silicon substrate 14 which, in this embodiment is p-doped as in the embodiment of FIGS. 1–6. In the left hand embodiment, the insulating material 20 extends through the silicon thin film 10' and terminates on the insulator 12'. The n+polysilicon 28 and the spacer 26 extend into thin film 10", thus forming the $n^{30}$ implant 27 in the silicon thin film 10". The second polysilicon 32 surrounded by insulating material 33 also extends into the silicon thin film 10" forming a diode connection as in the previously described embodiment.

On the right hand side of FIG. 7, a slightly different embodiment is shown. In this embodiment, the insulating material 20' extends through both of silicon thin films 10', 10" and layer of insulation 12', terminating on insulator 12". The polysilicon 28 and spacer 26 extend into the silicon substrate 14, the n+ well 27 being formed in the silicon substrate 14, just as in the embodiment of FIGS. 1–6. The polysilicon 32 and insulating material also extend into the substrate 14. These two embodiments function in the same manner as the embodiment of FIGS. 1–6.

While the invention has been described in combination with specific embodiments thereof, there are many alternatives, modifications, and variations that are likewise deemed to be within the scope thereof. Accordingly, the invention is intended to embrace all such alternatives, modifications and variations as fall within the spirit and scope of the present invention as defined and limited by the appended claims.

What is claimed is:

1. A thermal monitor comprising:
   a semiconductor thin film on an insulator using SOI technology mounted on a second semiconductor;
   an opening extending through said thin film and through said insulator and partially into said second semiconductor, and terminating at an end wall;
   a conductive material disposed in said opening and extending to said end wall;
   said second semiconductor having a P/N junction formed therein adjacent said end wall; and
   an insulating spacer material surrounding said conductive material, and being sufficiently thin to allow temperature excursions in said semiconductor thin film to pass there through.

2. The invention as defined in claim 1 wherein each semiconductor is silicon.

3. The invention as defined in claim 2 wherein said second semiconductor has a well doped with a first material having a first conductivity.

4. The invention as defined in claim 3 wherein said first material is a p-material.

5. The invention as defined in claim 2 wherein said conductive material in said opening is polysilicon.

6. The invention as defined in claim 4 wherein said P/N junction is formed with an N+ diffusion in said p-well.

7. The invention as defined in claim 1 wherein a second insulating material sufficiently thick to shield against any appreciable temperature increase partially surrounds said insulator spacing material displacing said thin film of conductive material completely where said second insulating material partially surrounds said insulator spacing material, surrounding said conductive material in said opening.

8. The invention as defined in claim 2 wherein there are a plurality of devices in said silicon thin film.

9. The invention as defined in claim 8 wherein there is an insulating barrier sufficiently thick to prevent any appreciable heat from passing therethrough, between said insulating spacer material and some, but not all, of said devices.

10. The invention as defined in claim 1 wherein there is a plurality of thin films, each on an insulator and overlying each other, and said opening extends through at least the top one of said thin films and at least one insulator.

11. The invention as defined in claim 2 wherein said second silicon conductor is a substrate.

12. The invention as defined in claim 2 wherein there is a plurality of thin films, each on an insulator and overlying each other, and said opening extends through at least the top one of said thin films and at least one insulator.

13. The invention as defined in claim 12 wherein said opening extends through two thin films and two insulators, and into said substrate terminating with said end wall in said substrate.

* * * * *